United States Patent
Bhowmik et al.

(10) Patent No.: US 7,401,986 B2
(45) Date of Patent: Jul. 22, 2008

(54) METHOD AND APPARATUS TO GENERATE AND MONITOR OPTICAL SIGNALS AND CONTROL POWER LEVELS THEREOF IN A PLANAR LIGHTWAVE CIRCUIT

(75) Inventors: Achintya K. Bhowmik, San Jose, CA (US); Nagesh K. Vodrahalli, Los Altos, CA (US); Gennady Farber, Los Altos, CA (US); Hai-Feng Liu, Cupertino, CA (US); Hamid Eslampour, San Jose, CA (US); Ut Tran, San Jose, CA (US); William B. Wong, Saratoga, CA (US); Ruolin Li, Santa Clara, CA (US); Jesper Jayaswal-Arentoft, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 11/497,954

(22) Filed: Aug. 1, 2006

(65) Prior Publication Data

US 2006/0285106 A1    Dec. 21, 2006

Related U.S. Application Data

(62) Division of application No. 10/357,630, filed on Feb. 3, 2003, now Pat. No. 7,099,360.

(51) Int. Cl.
*G02B 6/36* (2006.01)
*H01S 3/13* (2006.01)

(52) U.S. Cl. .................. 385/89; 385/14; 385/50; 385/89; 372/29.021; 372/50.21

(58) Field of Classification Search .............. None
See application file for complete search history.

(56) References Cited

U.S. PATENT DOCUMENTS

| 5,170,448 | A | * | 12/1992 | Ackley et al. ............ 385/31 |
| 5,774,486 | A | * | 6/1998 | Jiang et al. ............. 372/31 |
| 5,999,670 | A | * | 12/1999 | Yoshimura et al. ........ 385/31 |
| 6,192,170 | B1 | | 2/2001 | Komatsu |

(Continued)

OTHER PUBLICATIONS

Sasaki, T. et al., "Multi-Channel Power Level Monitor With Upward-Reflector and Sensor-Array Integrated In Planar Lightwave Circuit", 2000 Optical Society of America.

*Primary Examiner*—Hemang Sanghavi
(74) *Attorney, Agent, or Firm*—Blakely, Sokoloff, Taylor & Zafman LLP

(57) ABSTRACT

Embodiments of an optical detection apparatus are disclosed which may include one or more of a waveguide, a trench formed in the waveguide, a reflective surface, and a photodetector. The waveguide may be formed in a semiconductor substrate to propagate an optical signal received at a first end of the waveguide. The trench may also be formed in the waveguide having a first sidewall and a second sidewall, the first and second sidewalls forming first and second angles with the waveguide's propagation direction. The second sidewall may include a reflective surface formed thereon. The photodetector may be configured to receive an optical signal propagated in the waveguide, through the first sidewall and reflected from the reflective surface on the second sidewall.

19 Claims, 6 Drawing Sheets

U.S. PATENT DOCUMENTS 6,320,888 B1    11/2001  Tanaka et al.
6,661,939 B2 *  12/2003  Kaneko et al. ................ 385/14
6,934,455 B2 *   8/2005  Skinner et al. .............. 385/129

2003/0223672 A1  12/2003  Joyner
2005/0018951 A1   1/2005  Mossberg et al.

* cited by examiner

METHOD AND APPARATUS TO GENERATE AND MONITOR OPTICAL SIGNALS AND CONTROL POWER LEVELS THEREOF IN A PLANAR LIGHTWAVE CIRCUIT

CROSS-REFERENCE TO RELATED APPLICATIONS

This is a divisional of U.S. patent application Ser. No. 10/357,630, filed on Feb. 3, 2003 now U.S. Pat. No. 7,099,360, which has been allowed.

FIELD OF THE INVENTION

Embodiments of the invention relate generally to optical communication systems and more specifically but not exclusively to multi-wavelength optical signal generators for use in optical communication systems.

BACKGROUND INFORMATION

Optical signal generators (e.g., lasers) are widely used in optical transmitters in wavelength division multiplexed ("WDM") optical communication systems. Some optical signal generators use a distributed feed-back (DFB) laser for each channel of the WDM system. The optical signals generated by the multiple DFB lasers are then combined using elements such as arrayed waveguide grating based multiplexer or any other multiplexer. However, because a separate DFB laser is used for each channel, the optical transmitters tend to have increased complexity and cost. Further, the output wavelength of a DFB laser is relatively sensitive to temperature changes (i.e., thermal wavelength drift). For example, applications using DFB lasers need to provide special attention to wavelength stability over the desired temperature range, thereby increasing complexity and cost. Thus, reduction of this temperature dependency is important task on its own merits.

In addition, the optical transmitters typically require circuitry to monitor the power of the optical signal of each channel of the WDM system. This power monitoring circuitry is generally separate from the DFB laser devices (i.e., discrete), increasing the complexity and costs of fabricating the optical transmitters.

Still further, in many WDM applications, the power levels of the optical signals (of the various WDM channels) are equalized. Some approaches use separate attenuator circuits (e.g., thermo-optic Mach Zendher devices) to equalize the power between channels. Again, such circuitry tends to increase the complexity and cost of fabricating optical transmitters.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

In the following detailed description, numerous specific details are set forth. However, it is understood that embodiments of the invention may be practiced without these specific details. In other instances, well-known circuits, structures, and techniques have not been shown in detail in order to not obscure the understanding of this description. These embodiments are described in sufficient detail to enable those of ordinary skill in the art to practice the invention. The following detailed description is, therefore, not to be taken in a limiting sense, and the scope of the invention is defined only by the appended claims.

Figure 1:
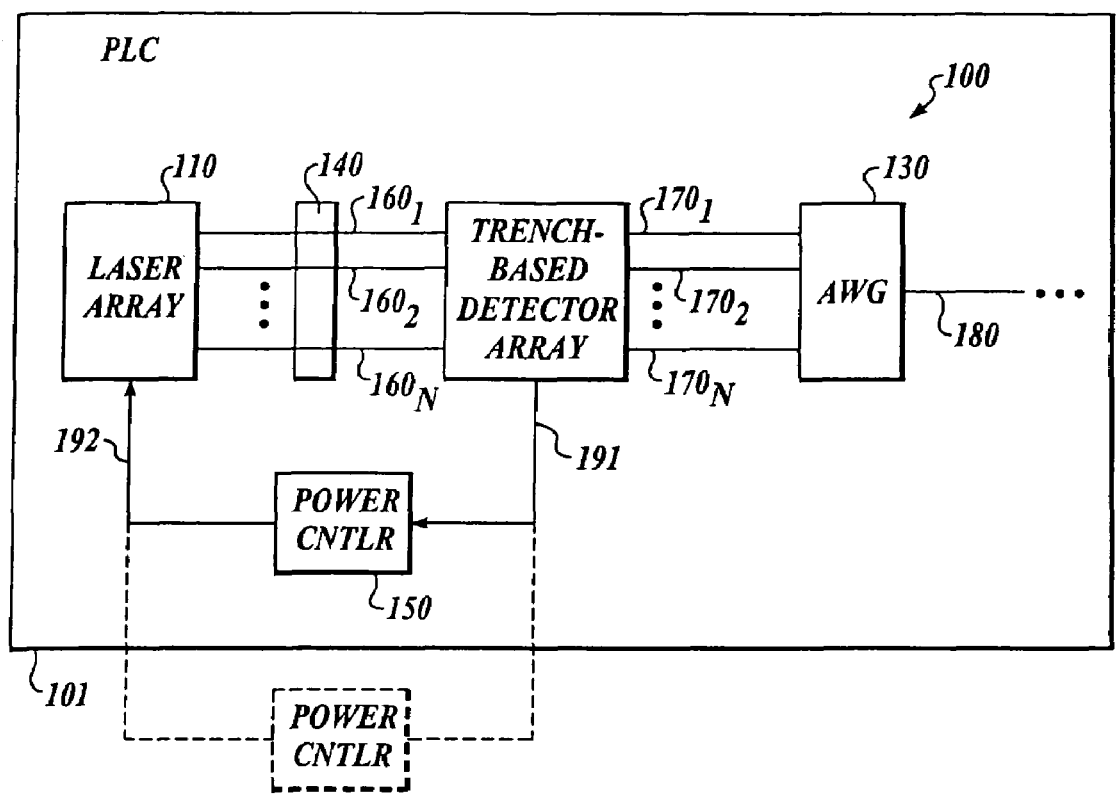
FIG. 1 is a block diagram illustrating an optical transmitter implemented on a planar lightwave circuit (PLC), according to one embodiment of the present invention.

FIG. 1 illustrates an optical transmitter 100 implemented on a planar lightwave circuit (PLC) 101, according to one embodiment of the present invention. In some embodiments, PLC 101 can have circuitry in addition to optical transmitter 100.

In this embodiment, optical transmitter 100 includes a laser array 110, a trench-based detector array 120, an arrayed waveguide grating (AWG) 130, a grating array 140, and a power controller 150. In some embodiments, power controller 150 is not integrated on PLC 101, as indicated by dashed lines in FIG. 1.

This embodiment of optical transmitter 100 is interconnected as follows. Laser array 110 has N optical signal output waveguides $160_1$-$160_N$ each having a corresponding grating of grating array 140 formed in these output waveguides. Thus, in this embodiment, grating array 140 has N gratings. As will be described below in more detail, each grating of grating array 140 defines a wavelength for a channel of an N-channel WDM system.

Detector array 120 has N optical input ports connected to corresponding waveguides of waveguides $160_1$-$160_N$. Detector array 120 also has N output ports, each connected to a corresponding waveguide of waveguides $170_1$-$170_N$. In this embodiment, detector array also has an electrical output port that is connected to an electrical input port of power controller 150 via a line 191. Power controller 150 also has an electrical output port, which is connected to an electrical input port of laser array 110 via a line 192.

AWG 130 has N input waveguides connected to a corresponding waveguide of waveguides $170_1$-$170_N$. AWG 130 is configured to combine all of the optical signals received at its input ports and output them via a waveguide 180.

In an alternative embodiment, laser array 110 may have a second set of output waveguides (e.g., on the opposite side of the laser gain blocks to propagate light passing through the laser gain block reflectors). Detector array 120 may be connected to these output waveguides rather than in the "primary" output ports of laser array 110.

In operation, laser array 110 and grating array 140 form an array of external cavity lasers providing optical output signals with N different wavelengths (i.e., a wavelength for each channel of an N-channel WDM system). These external cavity lasers are described below in more detail in conjunction with FIG. 2.

Detector array 120, in this embodiment, is used to monitor the power of each of the N optical signals generated by the external cavity lasers formed by laser array 110 and grating array 140. Detector array 120 is described below in more detail in conjunction with FIGS. 3 and 4. In some embodiments, different power monitoring circuitry can be used with the external cavity lasers formed by laser array 110 and grating array 140. Still further, in some embodiments, different optical signal sources can be used with detector array 120.

Detector array 120 provides signals to power controller 150 indicative of the power of each the N optical signals. The interconnection between detector array 120 and power controller 150 is described below in conjunction with FIGS. 5 and 5A.

Power controller 150 can then provide control signals to laser array 110 to adjust the power of each of the N optical signals as desired for the application. One embodiment of this operation is described below in conjunction with FIG. 6. In addition, power controller 150 can include a laser drive circuit (or other circuitry) to directly modulate the optical signals output by laser array 110 (e.g., on-off keying (OOK)). The N optical signals are then multiplexed and/or combined by AWG 130.

These embodiments of optical transmitter 100 can provide several advantages. For example, in embodiments that use the external cavity lasers formed by laser array 110 and grating array 140, the external cavity lasers can be implemented using substantially identical laser gain blocks (with the wavelengths being defined by grating array 140), rather than multiple lasers of different wavelengths. Further, the laser gain blocks can be fabricated as a "laser bar" (i.e., multiple blocks cleaved as a "bar" from a wafer) rather than being singulated. Another advantage of using external cavity lasers with laser bar is that integration and positioning/alignment of the laser bar becomes a less stringent process compared to that of separate laser gain modules (in which each module is aligned with its corresponding waveguide with a specified accuracy. Other advantages of the external cavity lasers are described below in conjunction with FIG. 2.

Another advantage, in embodiments that use detector array 120, is that detector array 120 can be easily integrated into PLC 101 due to its trench-based design. Thus, the use of detector array 120 can advantageously reduce the size and costs of fabricating optical transmitter 100.

In addition, in embodiments using detector array 120, the feedback control of the laser source (i.e., laser array 110) via detector array 120 and controller 150 can eliminate the need for separate variable attenuators that are typically located downstream of the laser source to equalize power between channels. This approach can simplify the design and can reduce size and costs. This approach is different from some current systems based on DFB or FP (Fabry-Perot) lasers in which feedback is used only to stabilize the wavelength power within relatively small range. However, some embodiments using detector array 120 can provide wavelength stabilization as well as power equalization.

Figure 2:
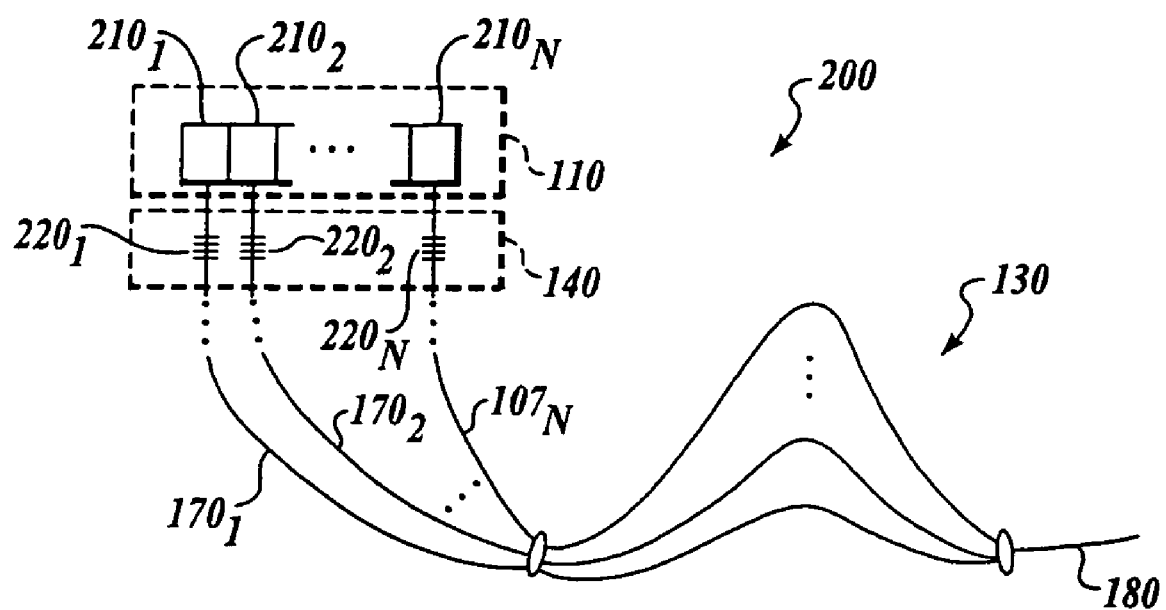
FIG. 2 is a block diagram illustrating an external cavity laser array for use in the optical transmitter of FIG. 1, according to one embodiment of the present invention.

FIG. 2 illustrates an external cavity laser array 200 implemented using laser array 110 (FIG. 1) and grating array 140 (FIG. 1), according to one embodiment of the present invention. Detector array 120 (FIG. 1) and power controller 150 (FIG. 1) are omitted from FIG. 2 to promote clarity.

This embodiment of external cavity laser array 200 includes laser gain blocks $210_1$-$210_N$, which are part of laser array 110. In this embodiment, laser gain blocks $210_1$-$210_N$ are substantially identical, and each has a reflective surface serving as one mirror of an external cavity. In one embodiment, laser gain blocks $210_1$-$210_N$ are implemented using the laser diodes of an array of edge emitting laser devices. In other embodiments, laser gain blocks $210_1$-$210_N$ are implemented using an array of vertical cavity surface emitting lasers (VCSELs).

This embodiment of external cavity laser array 200 also includes gratings $220_1$-$220_N$, which are part of grating array 140. Gratings $220_1$-$220_N$ serve as the other mirrors for the array of external cavity lasers. In this embodiment, gratings $220_1$-$220_N$ have a reflectivity of about 60%, although in other embodiments a reflectivity ranging from about 50% to 70% may be used. Each of gratings $220_1$-$220_N$ are designed for the corresponding block of laser gain blocks $210_1$-$210_N$ according to the wavelength defined by the grating and the modes of the external cavity formed thereby.

In one embodiment, gratings $220_1$-$220_N$ are implemented as silicon-based waveguide Bragg gratings (WBGs) formed in the waveguides implementing the input ports of AWG 130 (which also serve as the output ports of laser array 110). For example, the WBGs may have alternating regions of doped and undoped (or doped with different dopants) silicon resulting in alternating regions of different indices of refraction. These regions would be made with the proper width and spacing for the desired Bragg wavelength. Alternatively, the WBGs may have alternating regions of different materials (e.g., silicon and oxide, or silicon and polysilicon). By using a silicon-based waveguide grating to define the output wavelength of each channel, wavelength drift under temperature changes can be reduced (e.g., DFB lasers typically have a drift of about 0.1 nm/° C. compared to about 0.01 nm/° C. for a silicon-based WBG).

In yet another embodiment, the WBGs may be tunable (e.g., thermal tuning) using currently available WBG technology so that a fine-tuning of the output wavelength can be performed. Such an embodiment can be advantageously used in WDM applications requiring precise wavelength allocation.

The spacing between the ports of the AWG 130 and the lengths of waveguides in the grating region of AWG 130 are configured to multiplex the output wavelength of each external cavity laser (defined by the Bragg wavelengths of the WBGs) to the output port connected to waveguide 180. Thus, AWG 130 would not direct other wavelengths that might be present in the optical signals output by laser array 110 to the output port connected to waveguide 180.

One advantage of this approach is that laser gain blocks $210_1$-$210_N$, can be fabricated as a single "bar" of substantially identical active components to assemble 1×N wavelength system, operating in conjunction with grating array 140 to output the desired wavelengths of the WDM system. The bar is a piece of laser material wafer that is diced so that it incorporates the multiple substantially identical laser gain blocks, which can reduce fabrication costs compared to singulated laser gain blocks and, in addition, simplify attachment and alignment of the laser gain blocks with waveguides $160_1$-$160_N$.

Figure 3:
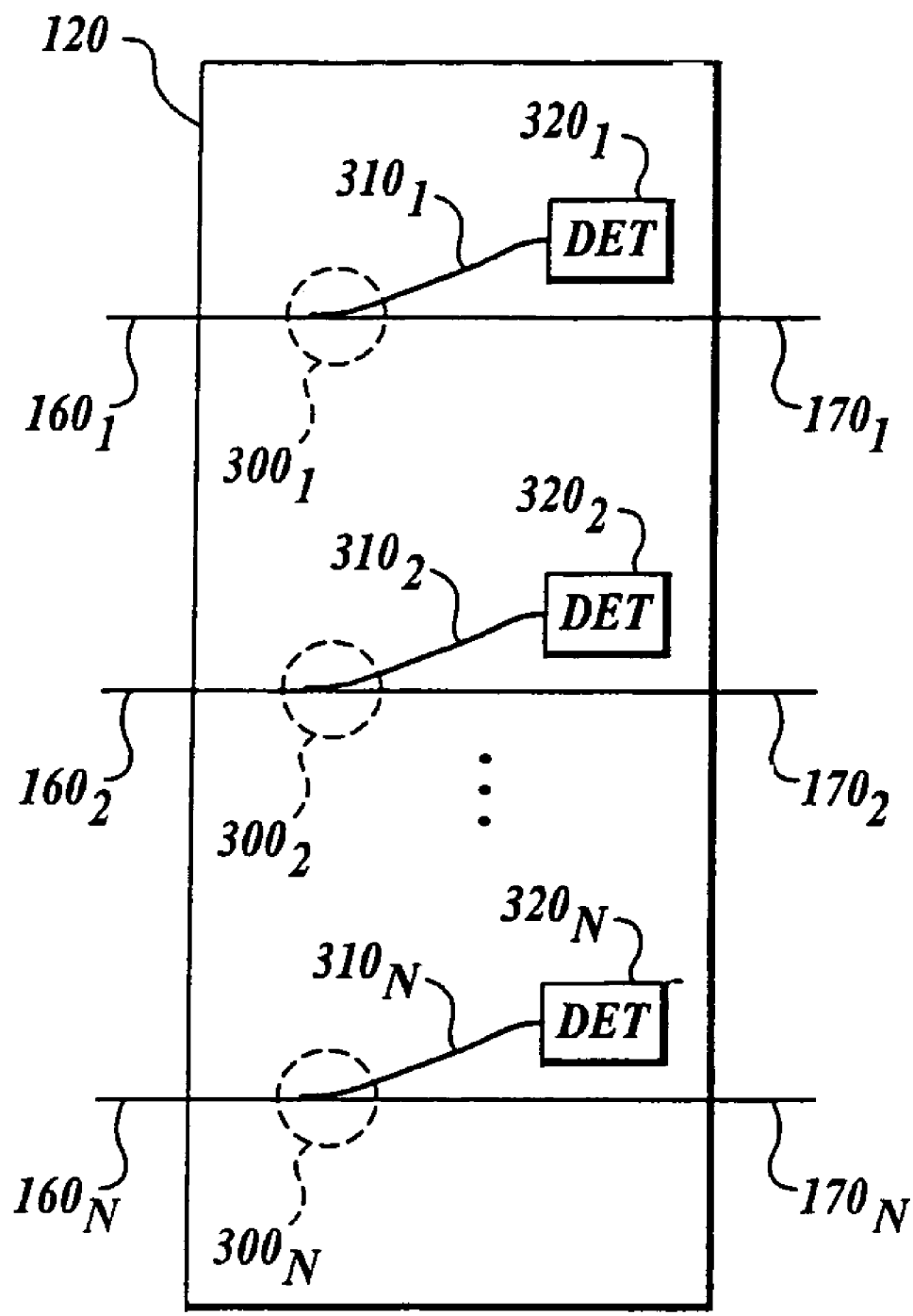
FIG. 3 is a block diagram illustrating an implementation of the trench-based detector array of FIG. 1, according to one embodiment of the present invention.

FIG. 3 schematically illustrates an implementation of the trench-based detector array 120 (FIG. 1), according to one embodiment of the present invention. In this embodiment, each detector of detector array 120 includes a tap coupler, a tap waveguide and a photodetector. More particularly, as shown in FIG. 3, tap couplers $300_1$-$310_N$ are respectively connected to waveguides $160_1$-$160_N$. Tap couplers $300_1$-$300_N$ have tap output ports respectively connected to tap waveguides $310_1$-$310_N$, which in turn are respectively connected to photodetectors $320_1$-$320_N$. In addition, tap couplers $300_1$-$300_N$ have "main" output ports respectively connected to waveguides $170_1$-$170_N$. In one embodiment, tap couplers $310_1$-$310_N$ are each configured to tap about 5% of the power of a received optical signal to its corresponding photodetector. For example, the tap couplers can be implemented using splitters or evanescent couplers configured to provide the desired power allocation between output ports. Further, in this embodiment, photodetectors $320_1$-$320_N$ are disposed on the surface of PLC 101 (FIG. 1) as described below in conjunction with FIG. 4.

Figure 4:
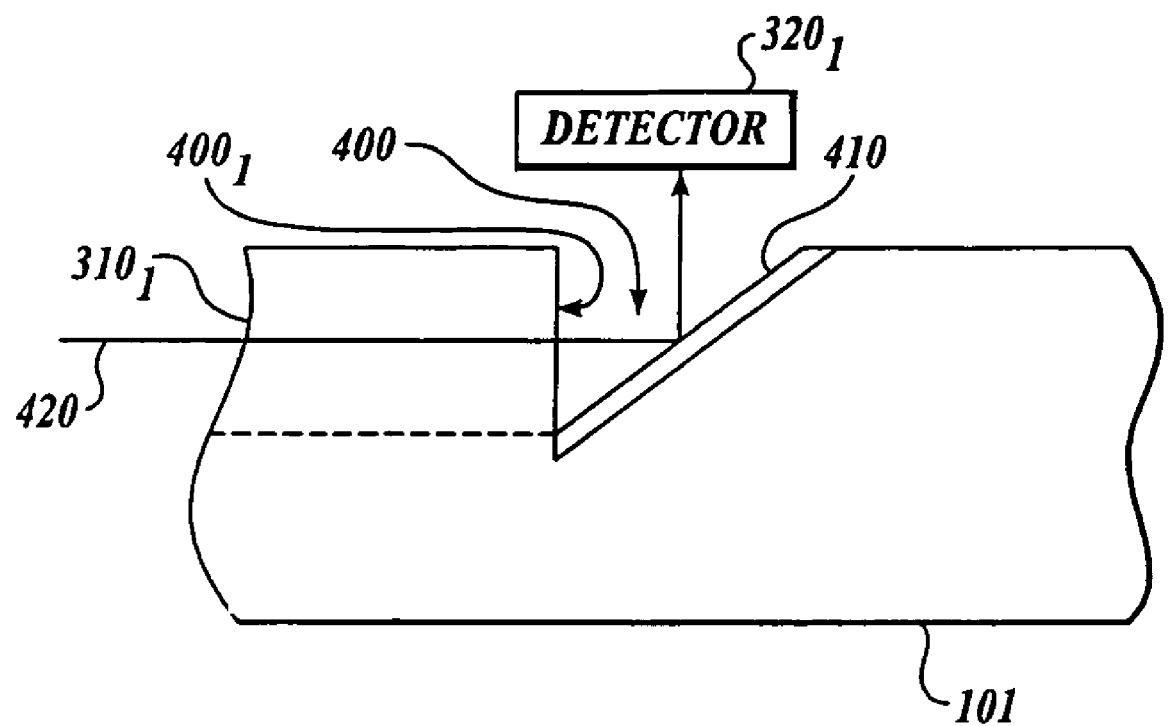
FIG. 4 is a block diagram illustrating a photodetector and asymmetric trench implementing an optical detector of the detector array of FIG. 3, according to one embodiment of the present invention.

FIG. 4 illustrates in cross section an arrangement of an optical detector of detector array 120 (FIG. 3), according to one embodiment of the present invention. The other N-1 optical detectors are substantially similar to the one depicted in FIG. 4. In this embodiment, an asymmetric trench 400 is formed in PLC 101 substantially perpendicular to the direction of light propagation in tap waveguide $310_1$. In particular, one sidewall $400_1$ of trench 400 is angled of about 98 to 105 degrees relative to the direction of propagation of the optical signal. In this embodiment, the other sidewall of trench 400 is angled at about 45 degrees relative to the direction of propagation of the optical signal, spaced about 10 to 50 microns away from sidewall $400_1$. In addition, a reflective surface 410 is formed on this sidewall. In one embodiment, reflective surface 410 is formed with a layer of metal such as Al, Au, TiW or combinations of different layers. Other embodiments use mirrors implemented using alternating layers of materials having different refractive indices (e.g., alternating layers of dielectric and semiconductor materials).

In this embodiment, photodetector $320_1$ is disposed above trench 400. In one embodiment, photodetector 3201 (as well as photodetectors $320_2$-$320_N$) are formed on a die that is attached to PLC 101 (FIG. 1) so that the photodetectors are aligned with trench 400. In some embodiments, a photopolymer is used to attach the die to PLC 101.

In operation, tap coupler $300_1$ (FIG. 3) taps a portion of the optical signal received via waveguide $160_1$. In one embodiment, the optical signal propagated via waveguide $160_1$ is generated by laser gain block $210_1$ (FIG. 2). The tapped portion of the optical signal is propagated through tap waveguide $310_1$ (indicated by arrow 420). This optical signal exits through sidewall $400_1$ of trench 400 and is reflected towards photodetector $320_1$ by reflective surface 410. Photodetector $320_1$ converts the received optical signal into an electrical signal, which is then provided to power controller 150 (FIG. 1). For example, the die containing photodetectors $320_1$-$320_N$ can use flip-chip bonding, wire bonding, tape automated bonding (TAB) or other interconnect techniques to conduct the electrical output signals from photodetectors $320_1$-$320_N$ to power controller 150.

Figure 5:
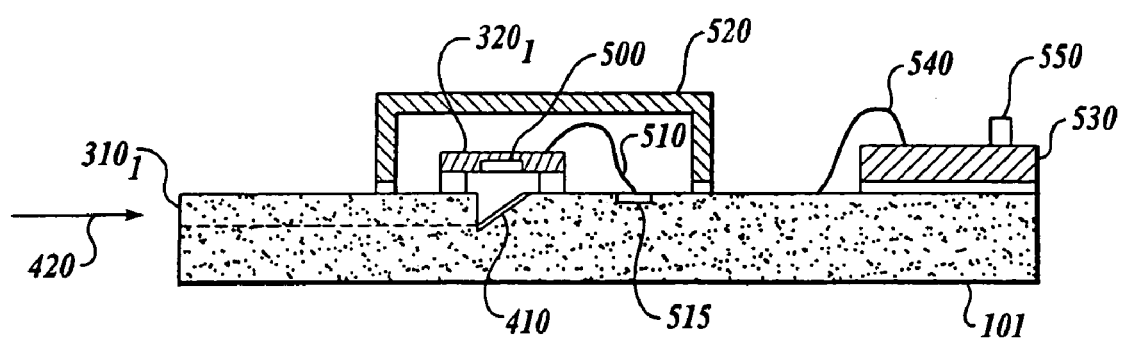
FIG. 5 is a diagram illustrating a cross section of a PLC showing an implementation of the photodetector and trench of FIG. 4, according to one embodiment of the present invention.

FIG. 5 illustrates a cross section of PLC 101 (FIG. 1) showing an implementation of photodetector $320_1$ and trench 400 (FIG. 4), according to one embodiment of the present invention. In this embodiment, photodetector $320_1$ has a photodiode 500 formed on the side of the die facing trench 400. A wire bond 510 is used to conduct the output signal generated by photodiode 500 to a conductive contact region 515 formed on the surface of PLC 101. Alternatively, wire bond 510 can be omitted and flip-chip bonding techniques can be used to interconnect the die containing photodetector $320_1$ to PLC 101. In this embodiment, a cap 520 is attached to PLC 101 to hermetically (or semi-hermetically in other embodiments) seal the photodetectors and prevent extraneous light from adding noise to the photodetector output signal and to protect the chips from degradation from environmental conditions (e.g., humidity).

In this embodiment, power controller 150 (FIG. 1) is external to PLC 101 (e.g., a processor or microcontroller mounted on a motherboard) and is connected to receive multiple signals from and provide power to PLC 101 via an electrical connector 530. In particular, connector 530 is connected to receive electrical signals via trances on PLC 101 (not shown) via wire bonds such as wire bond 540 used to conduct the output signal of photodiode 500 to connector 530 (via contact region 515). Power controller 150 can then receive the output signal of photodiode 500 via a pin 550 of connector 530.

In operation, optical signal 420 (from tap coupler $300_1$ (FIG. 3)) is propagated through tap waveguide $310_1$ and reflected off reflective surface 410 of asymmetric trench 400 (FIG. 4). The reflected optical signal is received directly by photodetector 500, facing the asymmetric trench. In one embodiment, photodetector 500 converts optical signal 420 into an electrical signal having a current as a function of the power of optical signal 420. This electrical signal is provided to power controller 150 (FIG. 1) via wire bond 510, contact region 515, conductive trace (not shown) formed on the surface of PLC 101, wire bond 540 and pin 550 of electrical connector 530. Power controller 150 then controls laser gain block $210_1$ (FIG. 2) to generate its output optical signal at a desired power level. The operation of power controller 150 is described below in conjunction with FIG. 6 in controlling the optical power level of each channel.

In an alternative embodiment, laser array 110 (FIG. 1) may include a laser drive circuit (not shown) or other means to directly modulate the output signals from laser array 110. Power controller 150 can then be used to modulate the optical output signals as well as to equalize channel power. In addition, in some embodiments, power controller 150 can be configured to disable the laser gain block(s) of unused channels.

Figure 5A:
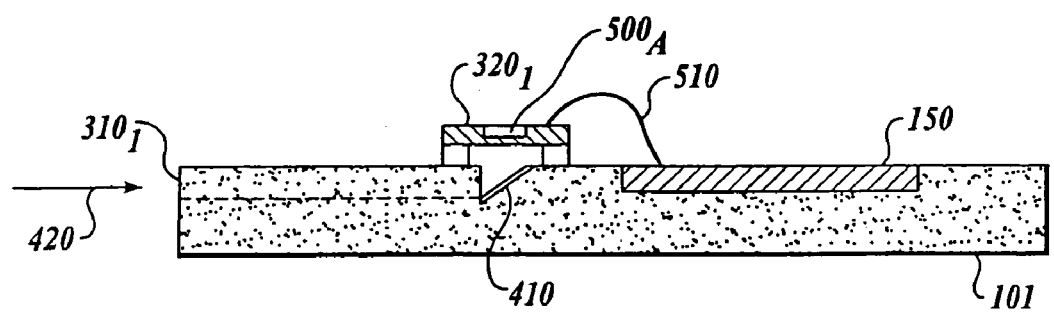
FIG. 5A is a diagram illustrating a cross section of a PLC showing an implementation of the photodetector and trench of FIG. 4 and the power controller of FIG. 1, according to another embodiment of the present invention.

FIG. 5A illustrates an alternative implementation of power controller 150 (FIG. 1) integrated on PLC 101 and photodetector $320_1$ and trench 400 (FIG. 4). In this alternative embodiment, photodiode 500A is formed on the side of the die facing away from trench 400. Wire bond 510 is used to conduct the output signal generated by photodiode 500A to an input lead of power controller 150.

In this embodiment, optical signal 420 is propagated through tap waveguide $310_1$, reflected off reflective surface 410 of the asymmetric trench, through the back side of the die to photodetector 500A. Power controller 150 receives the electrical output signal of photodetector 500A via wire bond 510, which in turn controls laser gain block $210_1$ as previously described.

Figure 6:
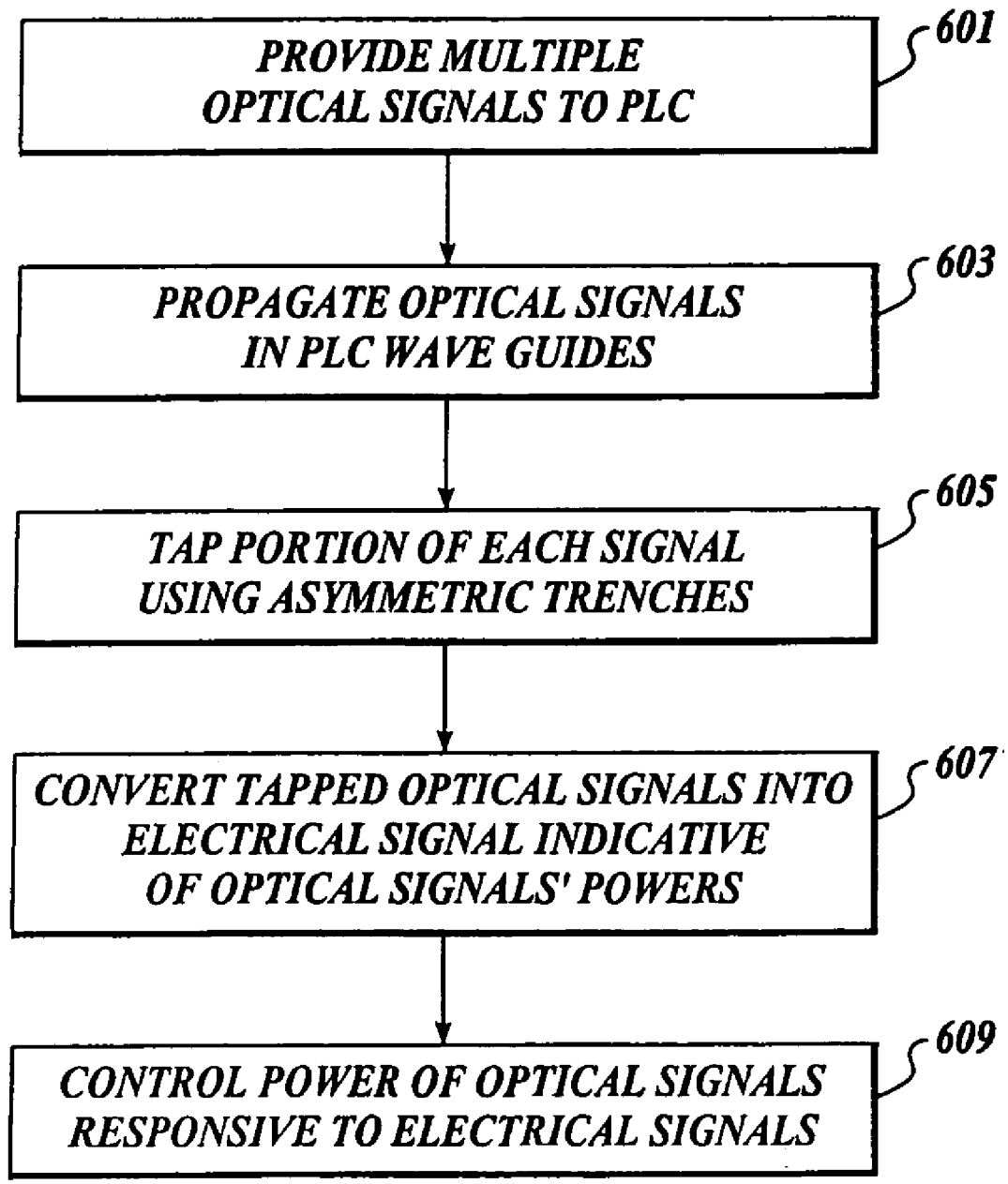
FIG. 6 is a flow diagram illustrating the operational flow of the optical transmitter in controlling the optical power of each channel of the optical transmitter's output, according to one embodiment of the present invention.

FIG. 6 illustrates the operational flow of optical transmitter 100 (FIG. 1) in controlling the optical power of each channel of the optical transmitter's output, according to one embodiment of the present invention. Referring to FIGS. 1 and 6, power controller 150 operates as follows in controlling the optical power level of each channel.

As represented by a block 601, multiple optical signals are provided to PLC 101. In one embodiment, these optical signals are generated by laser array 110, which is integrated on PLC 101. In one embodiment, laser array 110 can be tuned to independently adjust the power level of each optical output signal outputted to waveguides $160_1$-$160_N$.

The multiple optical signals, as represented by a block 603, are propagated in waveguides formed in PLC 101. A relatively small portion of each optical signal is then tapped from the waveguides. In this embodiment, detector array 120 taps off the small portions of each optical signal using tap couplers $300_1$-$300_N$ (FIG. 3). In one embodiment, detector array 120 taps about 5% of the power from each optical signal. Ideally, in that embodiment, each tapped portion is matched with regard to percentage of power being tapped. This operation is represented by a block 605.

Then as represented by a block 607, the tapped portions of the optical signals are converted into corresponding electrical signals. In one embodiment, detector array 120 converts the tapped portions into electrical signals using photodetectors $310_1$-$310_N$ (FIG. 3). In some embodiments, each electrical signal has a current level that is proportional to the power level of its corresponding tapped portion.

The power level of each optical signal outputted by optical transmitter 100 is controlled to a desired level, as represented by a block 609. In one embodiment, power controller 150 controls the power levels of each channel to be substantially identical. More particularly, power controller 150 receives the electrical signals corresponding to each channel from detector array 120, and responsive to the current level of each signal, controls the corresponding laser gain block to appropriately decrease/increase its output power to achieve the desired power level. This process implements a control loop, as indicated by the return of the operational flow from block 609 back to block 601.

In some embodiments, power controller 150 is implemented using analog circuitry. In alternative embodiments, power controller 150 is implemented using a microcontroller or other processor. These alternative embodiments can be advantageously used with laser arrays that include a laser drive circuit so that power controller 150 can be programmed to modulate the laser output signals as well as equalize the power.

Embodiments of method and apparatus to generate and monitor optical signals and control power levels thereof in a PLC are described herein. In the above description, numerous specific details are set forth (such as laser devices, AWGs, photodetectors, etc.) to provide a thorough understanding of embodiments of the invention. One skilled in the relevant art will recognize, however, that embodiments of the invention can be practiced without one or more of the specific details, or with other methods, components, materials, etc. In other instances, well-known structures, materials, or operations are not shown or described in detail to avoid obscuring the description.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In addition, embodiments of the present description may be implemented not only within a semiconductor chip but also within machine-readable media. For example, the designs described above may be stored upon and/or embedded within machine readable media associated with a design tool used for designing semiconductor devices. Examples include a netlist formatted in the VHSIC Hardware Description Language (VHDL) language, Verilog language or SPICE language. Some netlist examples include: a behavioral level netlist, a register transfer level (RTL) netlist, a gate level netlist and a transistor level netlist. Machine-readable media also include media having layout information such as a GDS-II file. Furthermore, netlist files or other machine-readable media for semiconductor chip design may be used in a simulation environment to perform the methods of the teachings described above.

Thus, embodiments of this invention may be used as or to support a software program executed upon some form of processing core (such as the CPU of a computer) or otherwise implemented or realized upon or within a machine-readable medium. A machine-readable medium includes any mechanism for storing or transmitting information in a form readable by a machine (e.g., a computer). For example, a machine-readable medium can include such as a read only memory (ROM); a random access memory (RAM); a magnetic disk storage media; an optical storage media; and a flash memory device, etc. In addition, a machine-readable medium can include propagated signals such as electrical, optical, acoustical or other form of propagated signals (e.g., carrier waves, infrared signals, digital signals, etc.).

The above description of illustrated embodiments of the invention, including what is described in the Abstract, is not intended to be exhaustive or to be limitation to the precise forms disclosed. While specific embodiments of, and examples for, the invention are described herein for illustrative purposes, various equivalent modifications are possible, as those skilled in the relevant art will recognize.

These modifications can be made to embodiments of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. An apparatus comprising:
   a plurality of waveguides formed in a semiconductor substrate to propagate optical signals received at a first end of the waveguides;
   a trench formed in the waveguides having a first sidewall and a second sidewall, the first and second sidewalls forming fast and second angles with the optical signals propagation direction;
   a reflective surface formed on the second sidewall;
   a detector array to receive respective optical signals propagated in the waveguides, through the first sidewall and reflected from the reflective surface on the second sidewall: wherein
   the detector array coupled to the waveguides and a plurality of laser gain blocks, the detector array to provide wavelength stabilization for the waveguides, to provide power usage equalization of the plurality of laser gain blocks, to monitor power of optical signals, and to balance the power of the optical signals by increasing and/or decreasing each optical signal to achieve a desired power level.

2. The apparatus of claim 1, wherein the detector array is positioned above the trench.

3. The apparatus of claim 1, wherein the first angle ranges from about 98 to 105 degrees and the second angle ranges from about 43 to 47 degrees.

4. The apparatus of claim 1, wherein the detector array is attached to the semiconductor substrate using a photopolymer.

5. The apparatus of claim 1, further comprising a cap attached to the semiconductor substrate to enclose the trench and detector array.

6. The apparatus of claim 1, further comprising a coupler attached to the first end of the waveguide, the coupler to receive an input optical signal and cause a portion of the input optical signal to propagate in the waveguide.

7. A method comprising:
propagating optical signals through a plurality of waveguides included in a semiconductor substrate, the waveguides having formed therein a trench having a first sidewall and a second sidewall, the first and second sidewalls forming first and second angles with the optical signals propagation direction;
receiving the optical signal using a photodetector array, the optical signal being propagated through the first sidewall and reflected from the second sidewall to the photodetector array;
multiplexing optical signals passing through gratings using an arrayed waveguide grating (AWG) such that selected wavelengths defined by the gratings are multiplexed to a smelt output waveguide of the AWG;
providing wavelength stabilization for a selected output wavelength;
providing power usage equalization of a plurality of laser gain blocks;
monitoring power of optical signals; and
leveling the power of the optical signals by increasing and/or decreasing each optical signal to achieve a desired power level.

8. The method of claim 7, further comprising positioning the photodetector array above the trench.

9. The method of claim 7, wherein the first angle ranges from about 98 to 105 degrees and the second angle ranges from about 43 to 47 degrees.

10. The method of claim 7, further comprising propagating an input optical signal to a coupler, the coupler causing a portion of the input optical signal to propagate in the waveguide.

11. An apparatus comprising:
an optical signal source array, each optical signal source to output an optical signal, a portion of which is propagated in a respective waveguide of a plurality of waveguides formed in a semiconductor substrate;
a trench formed in the waveguides having a first sidewall and a second sidewall, the first and second sidewalls forming first and second angles with the optical signals propagation direction, the second sidewall having a reflective layer, the portion of the optical signal propagated in each of the waveguide being propagated through the first sidewall and reflected from the second sidewall;
a photodetector array, each of the photodetector in the array to output a signal indicative of a power level of the portion of the optical signal reflected from the second sidewall; and a controller to provide, to the optical signal source array, a control signal responsive to the signal outputted by the photodetector array, each of the optical signal source to control a power level of the optical signal source responsive to the control signal; wherein
the photodetector array coupled to the waveguides and a plurality of laser gain blocks, the photodetector array to provide wavelength stabilization for the waveguides, to provide power usage equalization of the plurality of laser gain blocks, to monitor power of optical signals, and to balance the power of the optical signals by increasing and/or decreasing each optical signal to achieve a desired power level.

12. The apparatus of claim 11, wherein the photodetector array is positioned above the trench.

13. The apparatus of claim 11, wherein the first angle ranges from about 98 to 105 degrees and the second angle ranges from about 43 to 47 degrees.

14. The apparatus of claim 11, further comprising a cap attached to the semiconductor substrate to enclose the trench and photodetector.

15. The apparatus of claim 11, further comprising a coupler to receive the optical signal and cause the portion of the optical signal to propagate in the waveguide.

16. A method comprising:
generating optical signals;
propagating a portion of each of the optical signal through a respective waveguide of a plurality of waveguides included in a semiconductor substrate, the waveguides having formed therein a trench having a first sidewall and a second sidewall, the first and second sidewalls forming first and second angles with the optical signals propagation direction;
generating output signals responsive to a power level of the portion of each of the optical signal using a photodetector array, the portion of the optical signals being propagated through the first sidewall and reflected from the second sidewall each of to the photodetector;
controlling a power level of the optical signal responsive to the output signal from each of the photodetector;
multiplexing optical signals passing through gratings using an arrayed waveguide grating (AWG) such that selected wavelengths defined by the gratings are multiplexed to a single output waveguide of the AWG;
providing wavelength stabilization for a selected output wavelength;
providing power usage equalization of a plurality of laser gain blocks:
monitoring power of optical signals; and
leveling the power of the optical signals by increasing and/or deceasing each optical signal to achieve a desired power level.

17. The method of claim 16, further comprising positioning the photodetector array above the trench.

18. The method of claim 16, wherein the first angle ranges from about 98 to 105 degrees and the second angle ranges from about 43 to 47 degrees.

19. The method of claim 16, further comprising propagating the optical signal to a coupler, the coupler causing the portion of the optical signal to propagate in the waveguide.

* * * * *